United States Patent [19]

Evans

[11] 4,085,362
[45] Apr. 18, 1978

[54] CHECK SYNCHRONISM

[75] Inventor: Robert Evans, Crawley, England

[73] Assignee: Stone-Platt Crawley Limited, Crawley, England

[21] Appl. No.: 715,949

[22] Filed: Aug. 19, 1976

[30] Foreign Application Priority Data

May 10, 1976 United Kingdom ............... 19173/76

[51] Int. Cl.² .......................................... G01R 25/00
[52] U.S. Cl. ................................ 324/83 D; 324/83 R; 324/140 D; 324/78 Z
[58] Field of Search .............. 324/140 D, 83 D, 77 G, 324/107, 108, 78 Z, 83 R; 361/244; 307/87, 232; 328/133

[56] References Cited

U.S. PATENT DOCUMENTS

| 3,885,199 | 5/1975 | Nohara | 324/83 D |
| 3,953,794 | 4/1976 | Moore | 324/83 D |
| 3,984,770 | 10/1976 | Chu | 324/83 D |

Primary Examiner—M. Tokar
Attorney, Agent, or Firm—Pallock, Vande, Sande & Priddy

[57] ABSTRACT

A check synchroniser for checking the synchronism between two alternating voltages comprises means for forming pulses corresponding to the frequency and phase of the two voltages to be synchronized, the width of the pulses depending upon the allowable frequency and phase error between the two voltages, the pulses representing the frequencies of the two voltages being wider than the pulses representing the phases of the two voltages, means for comparing the time coincidence between the pulses of both sets and means for indicating when the pulses of both sets partially or completely overlap.

6 Claims, 2 Drawing Figures

CHECK SYNCHRONISM

This invention relates to an improved check synchroniser which is used to check that a generator is in synchronism with an existing power supply before it is switched in parallel.

BACKGROUND OF THE INVENTION

Most power systems employ more than one electrical generator to supply the required load. Each generator is switched in or out of the system to meet the demand load.

Before the incoming generator can be paralleled to the bus bars the following conditions must be fulfilled:
(i) The machine voltage must be equal to the system voltage.
(ii) The phase of the generator voltage must be in substantial coincidence with that of the system.
(iii) The frequency of the generator voltage must be the same as that of the system.

In practice these conditions are only approximately adhered to. The operator brings the incoming generator voltage, phase and frequency up to the required limit using a voltmeter and synchrosope and switches in the alternator when all three factors are satisfied. However, as a safety measure, a check synchroniser is also linked into the system to ensure that conditions are correct before the circuit breaker is closed.

In its simplest form, check synchroniser is a piece of apparatus which determines when the voltage phase and frequency are within safe limits for paralleling. The output relay contacts of the unit are connected in series with a no-volts coil so that, unless its contacts are closed, the circuit breaker cannot be closed.

SUMMARY OF THE INVENTION

According to the present invention, there is provided a check synchroniser comprising means for forming pulses corresponding to the frequency and phase of the two voltages to be synchronised, the width of the pulses depending upon the allowable frequency and phase error between the two voltages, the pulses representing the frequencies of the two voltages being wider than the pulses representing the phases of the two voltages, means for comparing the time coincidence between the pulses of both sets and means for indicating when the pulses of both sets partially or completely overlap.

BRIEF DESCRIPTION OF THE DRAWINGS

Preferred embodiments of the present invention will now be described with reference to the accompanying drawings in which.

DETAILED DESCRIPTION OF THE PREFERRED EMBODIMENT

Figure 1:
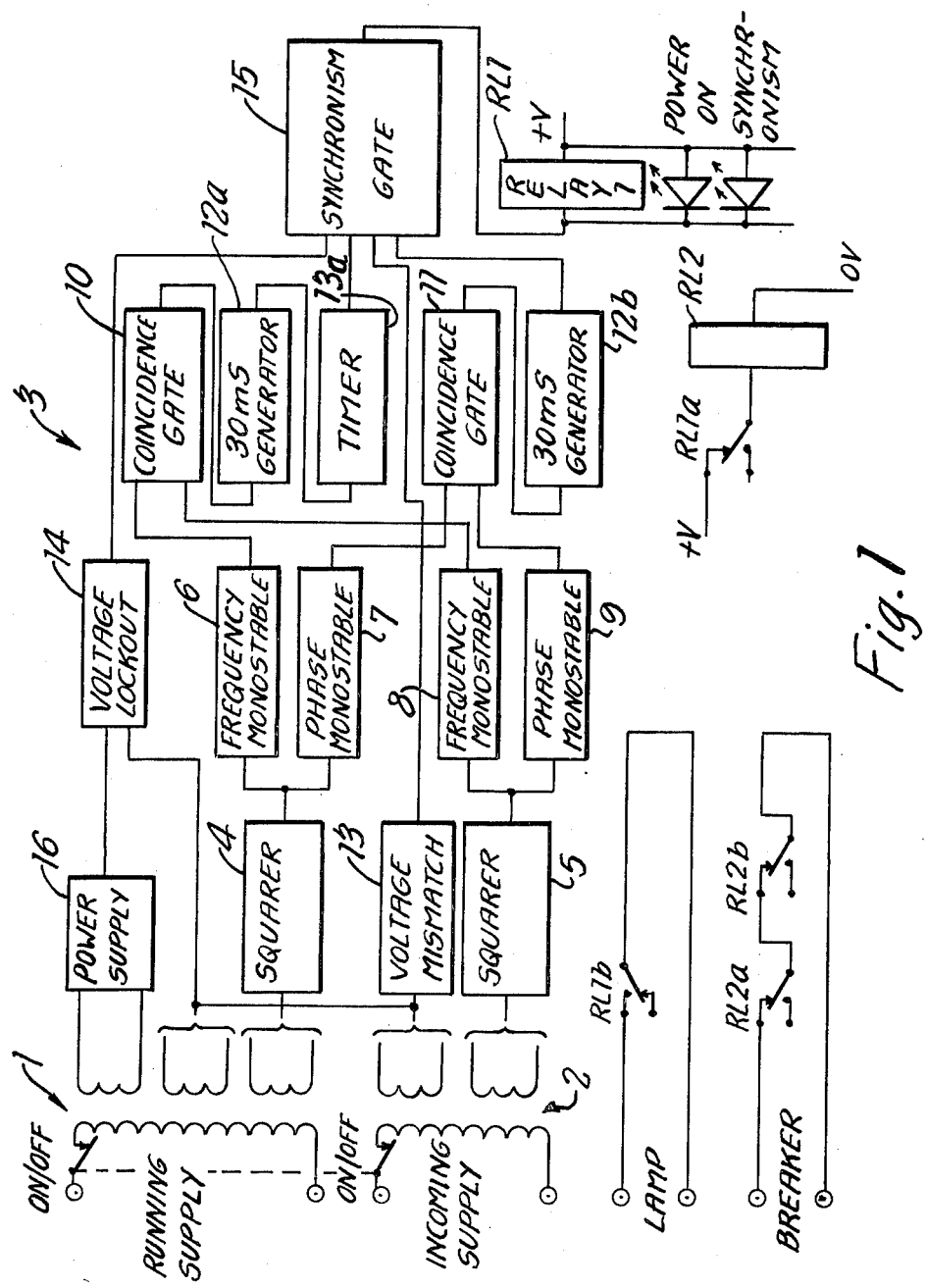
FIG. 1 is a block circuit diagram of a manually operated check synchroniser.

Transformers 1 and 2, connected to the running busbar supply and the incoming supply to be connected to the bus-bar respectively, supply inputs to the circuit 3. Sine waves corresponding to the two supplies are fed to squaring circuits 4 and 5, each in the form of a voltage comparator producing a square wave output which accurately coincides with the zero crossing points of the input sine wave.

The square wave output from each of the squaring circuits 4 and 5 is used to trigger two monostables 6 and 7, and 8 and 9 respectively. The outputs from the two monostables 6 and 8 correspond to the frequency of the running and incoming voltage supplies and these two outputs are fed as inputs to a coincidence gate 10. Similarly, output signals from the two monostables 7 and 9 correspond to the phase of the running and input voltages respectively and are fed as inputs to a coincidence gate 11. The width of the pulse output from each monostable is controllable over a range depending upon the allowable phase and frequency error.

The phase and frequency circuits are very similar; pulses from the frequency monostables 6 and 8 are preferably always larger, for example 5° larger than the phase pulses i.e. the frequency pulse. As the frequency and phase of the generator output are brought into coincidence with the supply, an overlap will occur with respect to the outputs of the frequency monostables 6 and 8 before coincidence is reached between the outputs of the phase monostables 7 and 9. From the moment that overlap first occurs between the outputs of the frequency monostables until overlap first occurs between the outputs of the phase monostables equals five electrical degrees. Will be 15° for a 10° phase pulse. Consequently, by timing the rate of change of phase for a 5° phase angle before phase tolerance is reached it is possible to determine the frequency error. For example, if the frequency difference must not exceed 0.25 Hz, the time limit to be measured by timer 13a is given by (1/0.25) × (5/360) = 55 ms. This method always ensures that the circuit breaker operates as soon as the allowable phase tolerance is reached.

The output pulses from each of the coincidence gates 10 and 11, which occur when the frequency and phase pulses from the monostables 6 and 8, and 7 and 9, respectively, partially or completely overlap, indicating that the two voltages are within tolerance as to frequency and phase, are used to trigger 30 ms d.c. level generators 12a and 12b. As the coincidence pulses are spaced at 20 ms the output is a d.c. level, which cancels within 10 ms, for a 50Hz supply frequency of a pulse being missed. This action resets the frequency timer 13a.

As the frequency and phase of the generator output are varied to bring them into coincidence with the supply, the occurrence of an output from gate 10 to 30 ms. generator 12a indicative of the start of overlap between the outputs of the frequency monostables 6 and 8, initiates an output from generator 12a which starts a 55 ms. timing operation by frequency timer 13a. If, after that time period, an output is received by synchronism gate 15 from the 30 ms. generator 12b to indicate the onset of overlap between the outputs of the phase monostables 7 and 9, this will establish the necessary equality in frequency since the frequency difference will then have been checked and shown to be less than the limiting rate of change of phase, i.e., a change in the amount of 5° in 55 ms. Then gate 15 will have two of the required inputs to enable this gate.

Voltage lockout and mismatch signals are obtained from voltage comparators 13 and 14 and some additional logic. When all the inputs to the synchronism gate 15 are high, then a relay RL1 is energized to connect the incoming supply in parallel with the running supply and a synchronism indicator lamp is illuminated via contacts RL1b. Contacts RL2a and RL2b connecting the incoming supply into the circuit are controlled by a second relay RL2, itself operated by the closing of contacts RL1a controlled by relay RL1 as indicated.

The unit contains its own 12 volt d.c. power supply 10 which is obtained from the running supply by way of a transformer and rectifier as shown.

Figure 2:
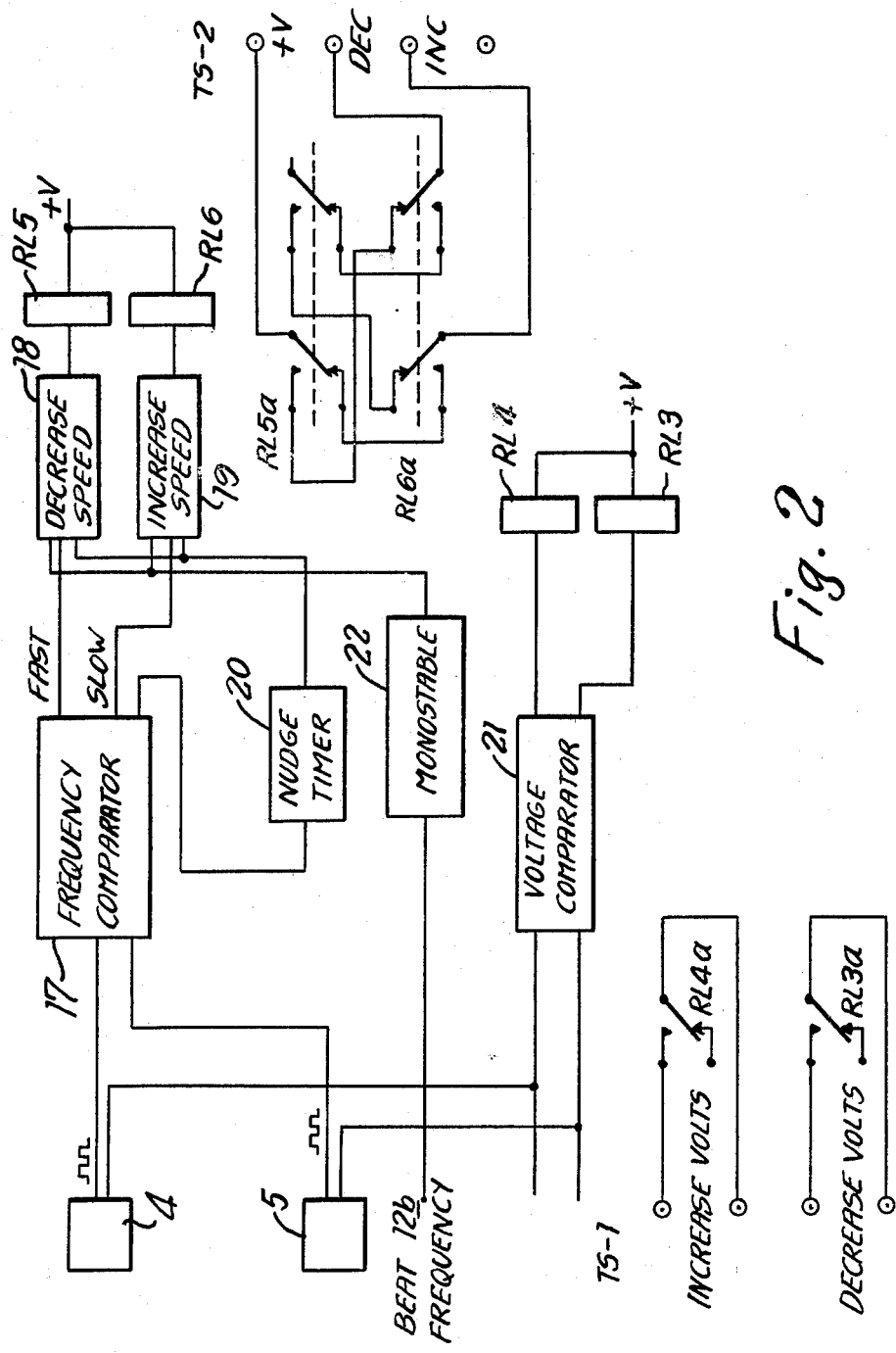
FIG. 2 is a block diagram of an additional circuit which can be connected to the circuit shown in FIG. 1 to allow for automatic operation of the check synchroniser.

FIG. 2 is a block diagram of an additional circuit which can be connected into the circuit of FIG. 1 to allow the synchronisation to be carried out automatically.

The outputs from the squaring circuits 4 and 5 (FIG. 1) are fed into a frequency comparator 17, which basically consists of a pair of binary counters and a bistable. A d.c. level appears on one of the two outputs from the comparator 17 depending upon whether the frequency of the incoming supply is greater than or less than the bus-bar frequency. In the former case, the signal acts to decrease the speed of the incoming supply generator, and in the latter to increase the speed. When the frequencies are exactly the same, the output from the circuit 17 remains at its previous state.

The outputs from the comparator 17 are fed to decrease and increase speed gates 18 and 19 along with a beat frequency signal from the 30 ms generator 12b via a monostable 22. As a result, an output is obtained from either of the gates 18 and 19 in time with the beat frequency. The gate 18 operates a relay RL5 which causes contacts RL5a to switch to the other position from that shown in the drawing. Similarly, gate 19 operates a relay RL6 causing contacts RL6a to switch over.

A 'nudge' circuit 20 consists of a timer, an oscillator and a monostable. When the frequency of the incoming supply and the bus-bar are identical but out of phase for a long enough period, the oscillator is enabled, giving out short pulses via the monostable, every 10 seconds for example, to the increase or decrease speed gates 18 and 19 depending upon the last output of the circuit 17. The frequency of the incoming supply then changes and the two can be brought into phase.

The incoming and bus-bar supply voltages are compared by a voltage comparator 21 and the excitation of the incoming supply generator is adjusted by way of output signals from the circuit 21 until both voltages are equal. When the generator voltage is too low, a signal from comparator operates a relay RL4 causing contacts RL4a to close so connecting the generator windings to increase its output voltage. Similarly when the generator voltage is too high, relay RL3 controlling contacts RL3a operates to decrease the output voltage.

I claim:

1. Apparatus for checking the synchronism of two alternating voltages comprising,
    means for generating a first pair of trains of square wave pulses corresponding to the zero crossing points of respectively said two alternating voltages with each pulse having a first width,
    means for generating a second pair of trains of square wave pulses also corresponding to the zero crossing points of respectively said two alternating voltages with each pulse having a second width less than that of said first width by a predetermined amount,
    first coincidence means for sensing overlap between the pulses of said first pair of trains of pulses,
    second coincidence means for sensing overlap between the pulses of said second pair of trains of pulses,
    and output means providing an output indication of said two alternating voltages having obtained coincidence of frequency and phase within preselected allowable limits only if said second coincidence means senses coincidence at least a predetermined time after said first coincidence means senses coincidence.

2. The apparatus of claim 1 which further includes means responsive to the amplitude of said two alternating voltages,
    said output means being also controlled by said further means.

3. The apparatus of claim 1 in which the output of said output means controls means for connecting said two alternating voltages in parallel.

4. The apparatus as claimed in claim 2 wherein the said square wave signals are fed as inputs to a frequency comparitor circuit, the output from which actuates means to increase or decrease the speed of a generator supplying one of said two voltages depending upon whether the frequency of the output voltage from said generator is less or greater than the frequency of the other of said two voltages.

5. A check synchroniser as claimed in claim 4 wherein means are provided to automatically alter the speed of said generator in the event of the two voltages being of equal frequency but out of phase.

6. A check synchroniser as claimed in claim 4 wherein a voltage comparator circuit is provided to compare the magnitude of the said two voltages, the output of said voltage comparitor acting to automatically increase or decrease the voltage output of said generator so as to equalize the magnitude of said two voltages.

* * * * *